(12) United States Patent
Shin (10) Patent No.: US 6,577,781 B2
(45) Date of Patent: Jun. 10, 2003

(54) OPTICAL INTEGRATED CIRCUIT DEVICE HAVING PROTRUSION, FABRICATION METHOD OF THE SAME AND MODULE OF OPTICAL COMMUNICATION TRANSMISSION AND RECEIVING APPARATUS USING THE SAME

(75) Inventor: Ki Chul Shin, Kyunggi-do (KR)

(73) Assignee: Iljin Corporation, Seoul (KR)

( * ) Notice: Subject to any disclaimer, the term of this patent is extended or adjusted under 35 U.S.C. 154(b) by 48 days.

(21) Appl. No.: 10/004,307

(22) Filed: Nov. 21, 2001

(65) Prior Publication Data

US 2002/0102043 A1 Aug. 1, 2002

(30) Foreign Application Priority Data

Nov. 23, 2000 (KR) .......................................... 2000-69802

(51) Int. Cl.[7] .................................................. G02B 6/12
(52) U.S. Cl. .............................. 385/14; 385/52; 438/29; 438/69; 372/46
(58) Field of Search .............................. 385/52, 49, 14; 438/29, 69; 372/46

(56) References Cited

U.S. PATENT DOCUMENTS

| 5,438,583 | A | * | 8/1995 | Narui et al. ................... 372/45 |
| 6,522,676 | B1 | * | 2/2003 | Goto ............................ 372/43 |
| 2002/0167018 | A1 | * | 11/2002 | Nakamura ................... 257/103 |
| 2002/0172248 | A1 | * | 11/2002 | Kito ............................ 372/46 |

* cited by examiner

Primary Examiner—John Juba, Jr.
Assistant Examiner—Leo Boutsikaris
(74) Attorney, Agent, or Firm—Roth & Goldman, P.A.

(57) ABSTRACT

The present invention relates to an optical integrated circuit device having a protrusion, a fabrication method of the same and a module of an optical communication transmission and receiving apparatus using the same. The optical integrated circuit device comprises a semiconductor substrate, an convex portion formed on an upper surface of the semiconductor substrate and having a taper shape lateral surface, a protection film formed on a lateral wall surface of the convex portion, a first electrode formed on an upper surface of the convex portion, and a second electrode formed on an upper surface of the semiconductor substrate, wherein said convex portion is formed of a first current disconnection layer, a second current disconnection layer and a clad layer.

8 Claims, 9 Drawing Sheets

OPTICAL INTEGRATED CIRCUIT DEVICE HAVING PROTRUSION, FABRICATION METHOD OF THE SAME AND MODULE OF OPTICAL COMMUNICATION TRANSMISSION AND RECEIVING APPARATUS USING THE SAME

BACKGROUND OF THE INVENTION

The present invention relates to an optical integrated circuit device, having a protrusion, a fabrication method of the same and a module of an optical communication transmission and receiving apparatus using the same, and in particular to an optical integrated circuit device having a protrusion, a fabrication method of same and a module of an optical communication transmission and receiving apparatus using the same which are capable of easily aligning the position of an optical integrated circuit device and optical fiber when assembling an optical communication transmission and receiving apparatus module, obtaining a short position aligning time and preventing a crack phenomenon at a corner portion of an optical integrated circuit device.

DESCRIPTION OF THE BACKGROUND ART

Generally, in order to align a light source (an optical integrated circuit device like a laser diode chip and a photo diode chip) of an optical communication transmission and receiving apparatus module capable of converting an electrical signal into an optical signal or an optical signal into an electrical signal and an optical fiber, an active alignment method and a passive alignment method are used.

The active alignment method requires a long time for aligning a laser diode and an optical fiber for thereby decreasing a mass production. In addition, the active alignment method needs many parts, so that it is impossible to implement a low cost product.

Therefore, the passive alignment method in which a current is not applied to a laser diode, and a laser diode and an optical fiber are directly coupled is increasingly used.

Figure 1A:
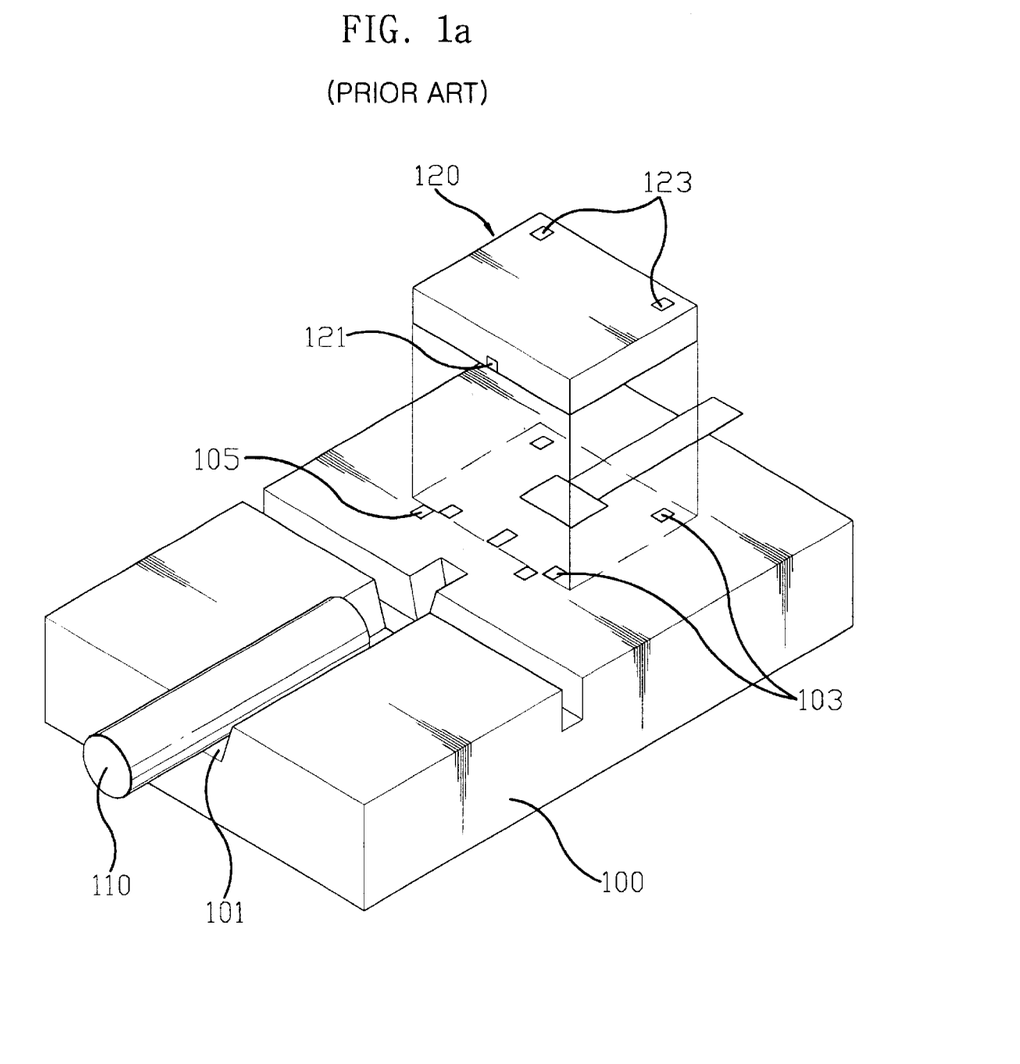
FIGS. 1A and 1B are disassembled respective views illustrating a conventional optical communication transmission and receiving apparatus module and a conventional method for manually aligning an optical integrated circuit device (laser diode chip) and an optical fiber.

FIG. 1A is a disassembled perspective view illustrating an optical communication transmission and receiving apparatus module for explaining a conventional active alignment method with respect to an optical integrated circuit device and an optical fiber.

As shown therein, the optical communication transmission and receiving apparatus module includes a mounting apparatus 100 for mounting an optical integrated circuit device, an optical fiber, etc. an optical fiber 110 installed in a V-shaped longitudinal groove 101 formed on an upper portion of the mounting apparatus 100, and an optical integrated circuit device (here, a laser diode) installed at an end portion of the optical fiber 110. At this time, a laser diode chip 120 is aligned and attached on an upper portion of the mounting apparatus 100 in such a manner that an active layer 121 which is a light emission layer of the laser diode chip 120 is positioned at the center of the optical fiber.

In order to implement an accurate alignment, a rotation adjusting mark 103, an optical axis adjusting mark 105, etc. are formed on an upper surface of the mounting apparatus 100. A position adjusting mark 123 is formed on the laser diode 120. FIG. 1A is a view of a method for checking whether the positions of the above marks are accurately aligned using an infrared ray camera. The optical fiber 110 and the active layer 121 of the laser diode chip 120 are matched in the above method.

Figure 1B:
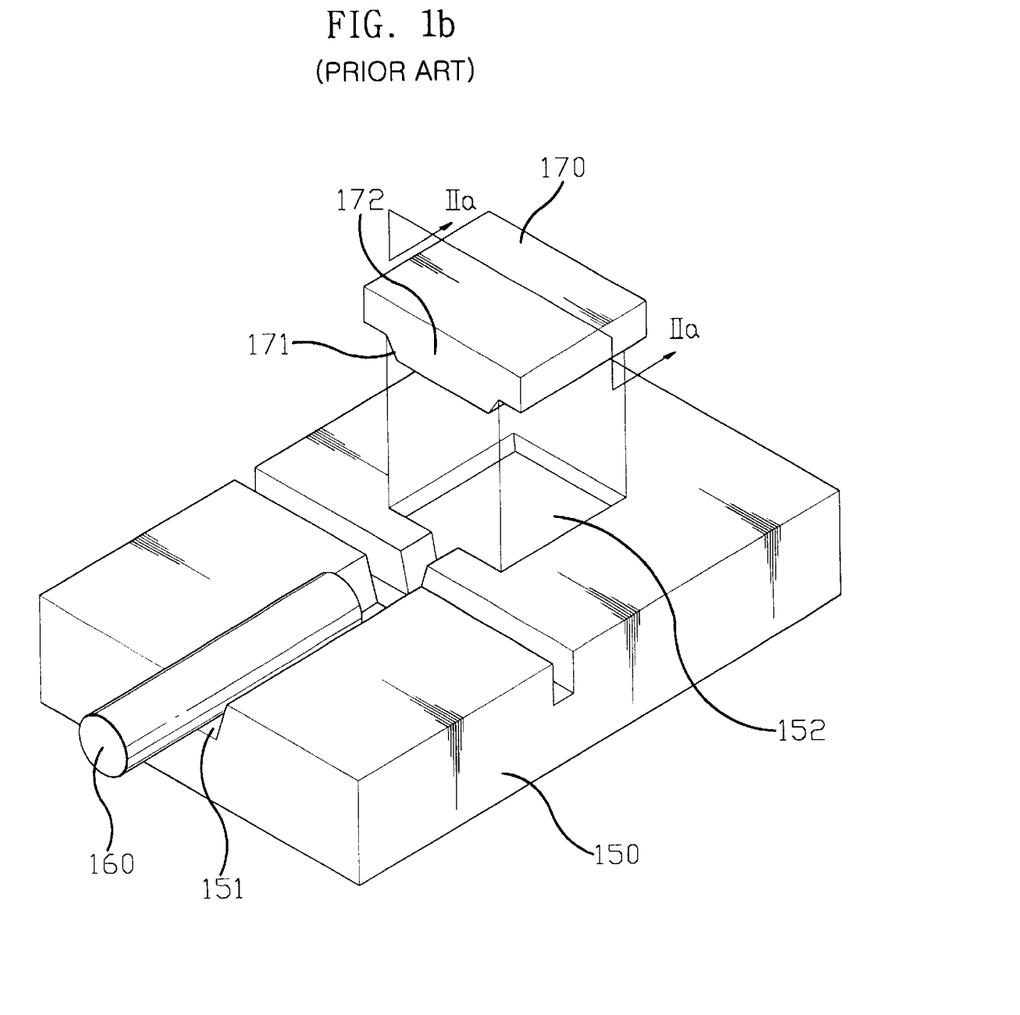

FIG. 1B is a disassembled perspective view of a conventional communication transmission and receiving apparatus module for explaining another example of a position alignment method with respect to an optical integrated circuit device and an optical fiber.

As shown therein, a V-shaped groove 151 is formed on an upper surface of the mounting apparatus 150. An optical fiber 160 is installed on an upper portion of the V-shaped groove 151. A concave portion 152 is formed at an end of the V-shaped groove 151 for mounting the optical integrated circuit device 170 therein. A convex portion 171 corresponding to the concave portion 152 is formed on the surface of the optical integrated circuit device 170. The convex portion 171 of the optical integrated circuit device 170 is inserted into the concave portion 152 of the mounting apparatus 150, so that the optical fiber 160 and the active layer 172 of the optical integrate circuit device 170 are matched.

However, the above-described conventional position alignment method has the following disadvantages.

Figure 2A:
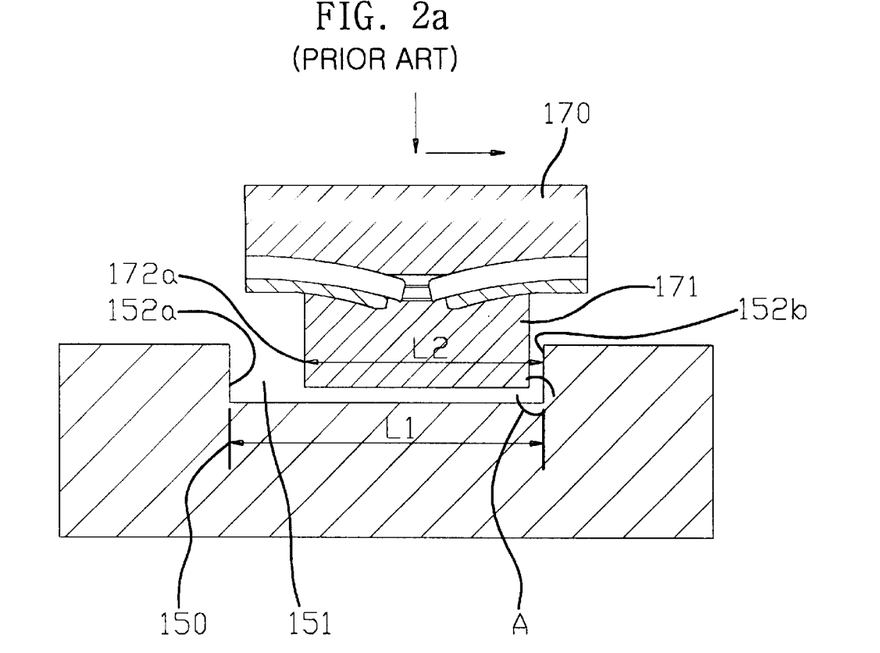
FIGS. 2A and 2B are cross-sectional views illustrating a conventional optical communication transmission and receiving apparatus module and a state that an optical integrated circuit device (laser diode chip) is manually aligned on an optical fiber and is mounted on a mounting apparatus.
Figure 2B:
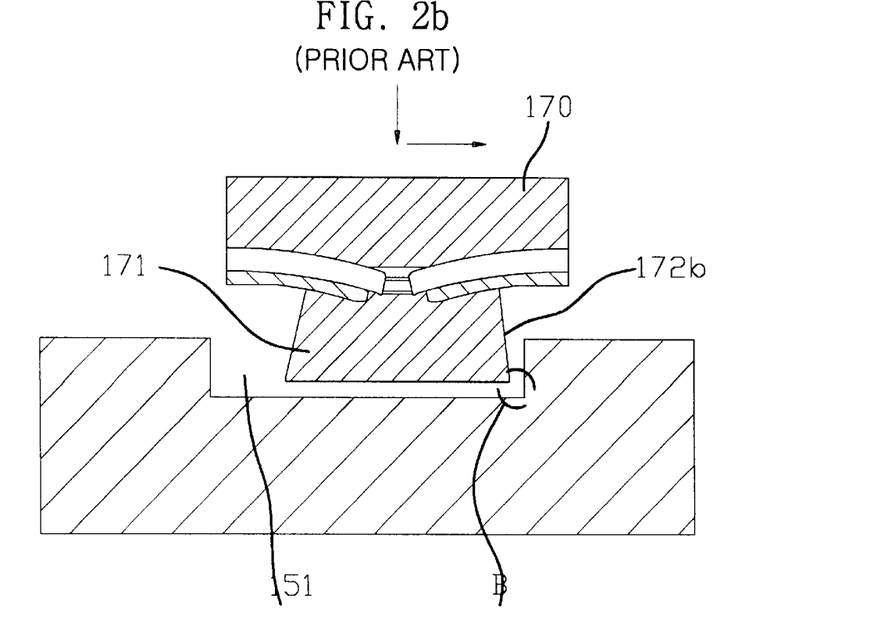

The method of FIG. 1A has an advantage in that the number of parts is decreased for aligning the optical integrated circuit device and the optical fiber. However, since an expensive flip chip bonder which requires an accurate resolution is used, the installation cost of the equipment is high. In addition, the above method is not better than an active alignment method in a view of the process time. The method of FIG. 1B will be explained with reference to FIGS. 2A and 2B. FIGS. 2A and 2B are vertical cross-sectional views taken along line IIa—IIa after mounting the optical integrated circuit device 170 of FIG. 1B on the mounting apparatus 150.

FIG. 2A is a view illustrating a convex portion 171 formed on an upper surface of the conventional optical integrated circuit device 170 in which a lateral surface 172a has a vertical profile. FIG. 2B is a view illustrating a convex portion of the conventional optical integrated circuit device 170 in which a lateral surface 172b has a reverse taper.

As shown in FIGS. 2A and 2B, the size L1 of the concave portion of the mounting apparatus 150 is larger than the size L2 of the convex portion 171 of the optical integrated circuit device 170. Therefore, as shown in FIGS. 2A and 2B, the convex portion 171 is inserted into the convex portion 152 of the mounting apparatus 150. The optical integrated circuit device 150 is horizontally moved so that the lateral surfaces 152a and 152b of the concave portion 152 and the lateral surfaces 171a and 171b of the convex portion 171 closely contact each other.

At this time, in the case of the convex portion 171 having a nearly perpendicular lateral wall profile, when inserting the convex portion 171 into the concave portion 152, an end portion A of the convex 171 collides with an upper portion of the mounting apparatus 150, so that the end portion A of the same may be cracked.

In the case that the convex portion 171 having a reverse taper lateral wall profile, an end portion B of the convex portion 171 may collide with a lateral wall of the concave portion 150 of the mounting apparatus, so that the end portion B of the same is cracked. Therefore, a certain defect may occur in the optical integrated circuit device due to the cracks. In addition, a matching property of an alignment between the optical fiber and the optical integrated circuit device may be decreased due to the reverse taper lateral wall profile.

SUMMARY OF THE INVENTION

Accordingly, it is an object of the present invention to provide an optical integrated circuit device and a fabrication method of the same which are capable of easily aligning the position of an optical integrated circuit device and optical fiber when assembling an optical communication transmission and receiving apparatus module, obtaining a short position aligning time and preventing a crack phenomenon at a corner portion of an optical integrated circuit device.

To achieve the above objects, there is provided an optical integrated circuit device comprising a semiconductor substrate, a convex portion formed on an upper surface of the semiconductor substrate and having a taper shape lateral surface, a protection film formed on a lateral wall surface of the convex portion, a first electrode formed on an upper surface of the convex portion, and a second electrode formed on an upper surface of the semiconductor substrate, wherein the convex portion is formed of a first current disconnection layer, a second disconnection layer and a clad layer.

A gradient of the lateral wall surface of the convex portion is 10~70° in a direction perpendicular from the surface of the semiconductor substrate.

The protection film is formed of a silicon film or a silicon nitride film.

To achieve the above object, there is provided an optical integrated circuit device fabrication method comprising a step for selectively growing an active layer on an upper surface of a semiconductor substrate using a MOCVD method, a step for selectively growing a first current disconnection layer on an upper surface of the semiconductor substrate at both sides of the active layer using the MOCVD method, a step for selectively growing a second current disconnection layer on an upper surface of the first current disconnection layer, a step for growing a clad layer on an upper surface of the second current disconnection layer and an upper portion of the active layer, a step for forming an etching mask on an upper surface of the clad layer on the active layer, a step for sequentially etching the clad layer, the second current disconnection later and the first current disconnection layer which are not covered by the etching mask and exposing an upper surface of the semiconductor substrate, a step for removing the etching mask, a step for forming a protection film on the lateral walls of the clad layer, the second current disconnection layer and the first current disconnection layer, and a step for forming a first electrode on an upper surface of the protection film and a second electrode on an upper surface of the semiconductor substrate.

The etching step is performed by a chemical etching method.

The etching solution used for the chemical etching method is $HCL:P_3OH$ or $HCL:CH_3COOH$.

The protection layer is formed of a silicon oxide film or a silicon nitride film.

To achieve the object, there is provided an optical communication transmission and receiving apparatus module comprising an optical integrated circuit device including a semiconductor substrate, a convex portion formed on an upper surface of the semiconductor substrate and having a taper shaped lateral surface, a protection film formed on a lateral wall surface of the convex portion, a first electrode formed on an upper surface of the convex portion, and a second electrode formed on an upper surface of the semiconductor substrate, wherein the convex portion is formed of a first current disconnection layer, a second current disconnection layer and a clad layer, a mounting apparatus having a concave portion having a reverse tape shaped lateral wall profile at an upper center portion of the same, a third electrode having a portion embedded in the mounting apparatus and another portion being extended to a lower surface of the concave portion, and a fourth electrode formed on an edge upper surface of the mounting apparatus, wherein the third electrode formed on a lower surface of the concave portion of the mounting apparatus and the first electrode of the optical integrated circuit device contact each other, and the second electrode of the optical integrated circuit device and the fourth electrode contact each other, and the protection film contacts with a lateral wall of the concave portion, so that the optical fiber and the optical integrated circuit device are manually aligned.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The embodiments of the present invention will be explained with reference to the accompanying drawings.

Figure 3:
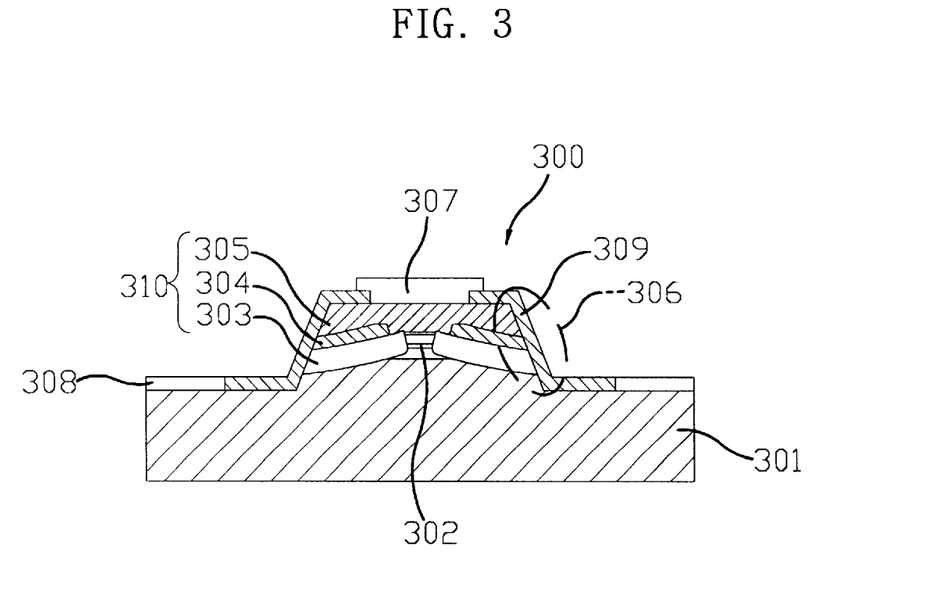
FIG. 3 is a cross-sectional view illustrating an optical integrated circuit device according to the present invention.

FIG. 3 is a cross-sectional view illustrating an optical integrated circuit device according to the present invention. An optical integrated circuit device 300 which is adapted as an embodiment of the present invention is an optical communication laser diode chip.

As shown therein, an optical integrated circuit device 300 according to the present invention includes an InP semiconductor substrate 301 of a p-type or n-type which is a base substrate 301, an active layer 302 formed on a center portion of the base substrate 301, a first current disconnection layer 303 formed on an upper surface of the base substrate 301 at both sides of the active layer 302, a second current disconnection layer 304 formed on an upper surface of the first current disconnection layer 303, and a clad layer formed on an upper surface of the second current disconnection layer 304 and an upper surface of the active layer 302. The first current disconnection layer 303, the second current disconnection layer 304 and the clad layer 305 which are sequentially stacked on the upper surface of the semiconductor substrate 301 each have an upper width narrower than the lower width of the same, so that the lateral surfaces of the first current disconnection layer 303, the second current disconnection layer 304 and the clad layer 305 are slanted. The lateral surface, namely, a slanted surface of the first current disconnection layer 303, the second current disconnection layer 304 and the clad layer 305 has a reference numeral of 306. In addition, a multiple-layer film formed of the first current disconnection layer 303, the second current disconnection layer 304 and the clad layer 305 is defined as a convex portion 310. The convex portion 310 has a tapered lateral wall profile. The slanted angle of the lateral surface of the convex portion 310 is 10~70° with respect to a vertical axis extended from the surface of the semiconductor substrate 301.

A first electrode 307 is formed on an upper surface of the clad layer 305. A second electrode 308 is formed on an upper edge portion of the semiconductor substrate 301. A protection film 309 is formed on an upper surface of the slanted surface 306 between the first electrode 307 and the second electrode 308. The protection film 309 is extended to a part of the upper surface of the clad layer 305 and covers a part of the upper surface of the semiconductor substrate 301.

In the optical integrated circuit device according to the present invention of FIG. 3, the first and second electrodes are formed on the semiconductor substrate, so that it is possible to remove a wire bonding process when assembling the optical communication transmission and receiving apparatus module.

Figure 4:
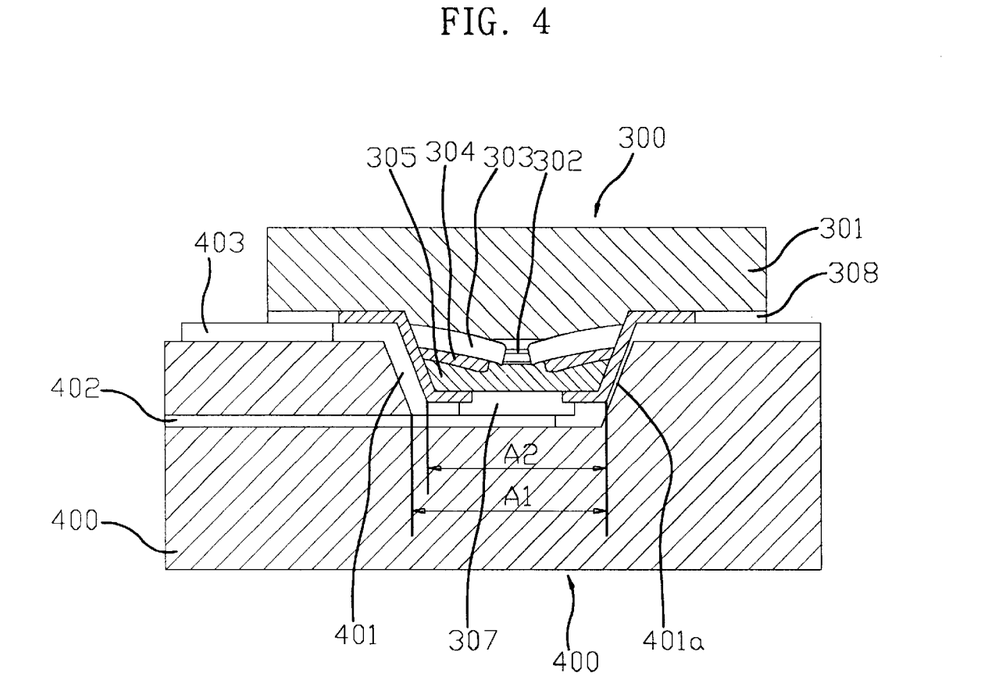
FIG. 4 is a cross-sectional view illustrating an optical communication transmission and receiving apparatus module and a state that an optical integrated circuit device is manually aligned on an optical fiber according to the present invention.

FIG. 4 is a cross-sectional view illustrating an optical communication transmission and receiving apparatus module fabricated using an optical integrated circuit device of FIG. 3 according to the present invention.

As shown in FIG. 4, the optical integrated circuit device 300 of FIG. 3 is mounted on an upper surface of the mounting apparatus (SiOB: silicon Optical Bench).

The optical communication transmission and receiving module includes a mounting apparatus 400 having a concave portion 402 at an upper center portion, and an optical integrated circuit device 300 mounted on the concave portion 401. The size A1 of the concave portion 401 is larger than the size A2 of the convex portion 310 by about 1 µm. The lateral wall profile of the concave portion 401 is formed in a reverse taper shape.

A third electrode 402 electrically connected with the first electrode 306 of the optical integrated circuit device is embedded in the mounting apparatus 400. The third electrode 402 is extended to an upper surface of the concave portion 401.

The first electrode 307 of the optical integrated circuit device 300 contacts with the third electrode 402 formed on an upper surface of the concave portion 401.

A fourth electrode 403 is formed on an upper edge portion of the mounting apparatus 400 for connecting with the second electrode 308 of the optical integrated circuit device 300. The second electrode 307 and the fourth electrode 403 are electrically connected by a first conductive wire 404.

A lateral wall 401a of the concave portion 401 of the mounting apparatus 400 is physically contacted with the protection film 309 formed on an upper surface of the slanted surface 306 of the optical integrated circuit device 300.

In the method of fabricating the module of FIG. 4, a position alignment is performed in such a manner that the convex portion 310 of the optical integrated circuit device 300 is positioned at the center of the concave portion 401 of the mounting apparatus 400. The optical integrated circuit device 300 is downwardly pressed so that the convex portion 310 is inserted into the concave portion 401. Next, the optical integrated circuit device 300 is pushed in a lateral direction, so that the lateral surface of the convex portion 310, namely, the protection portion 309 formed in the slanted surface 306 does not physically contact with the lateral wall 401a of the concave portion 401, whereby the positions of the optical fiber (not shown) and the optical integrated circuit device 300 are automatically aligned.

As shown in FIG. 4, in the mounting apparatus for fabricating the optical integrated circuit device and the optical communication transmission and receiving apparatus module, since each electrode is directly contacted each other and electrically connected, so that a conductive wire formation process is not needed for thereby implementing a simpler and economic fabrication process.

As shown in FIG. 4, in the optical communication transmission and receiving apparatus module according to the present invention, since the convex portion 310 of the optical integrated circuit device 300 is inserted into the concave portion 401 of the mounting apparatus 400, the position alignment of the optical fiber and the optical integrated circuit device 300 is automatically implemented. In addition, since the convex portion 310 and the concave portion 401 have a taper shaped lateral wall and a reverse taper shaped lateral wall, when the optical integrated circuit device is inserted into the mounting apparatus, the corner portions of the optical integrated circuit device is not cracked. In addition, the protection film 309 which covers the slanted surface 306 of the convex portion 310 of the optical integrated circuit device prevents the optical integrated circuit device from being physically damaged when the optical integrated circuit device is inserted into the mounting apparatus and implements a smooth insertion that the convex portion 310 is smoothly inserted into the concave portion 401. In addition, the protection film prevents other portions from being contacted except for that the optical circuit device and the mounting apparatus contact with the electrodes, so that it is possible to enhance an electrical reliability of the optical communication transmission and receiving module.

The fabrication method of the optical integrated circuit device according to the present invention will be explained with reference to FIGS. 5A through 5G.

Figure 5A:
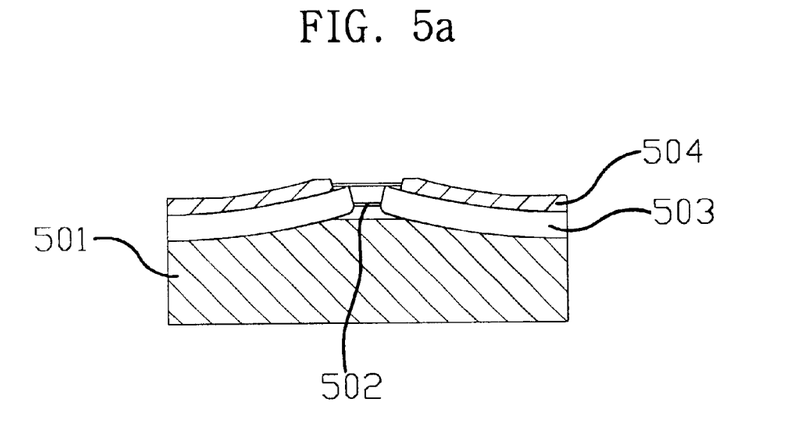
FIGS. 5A through 5G re cross-sectional views illustrating a fabrication method of an optical integrated circuit device based on a fabrication sequence of an optical integrated circuit device according to an embodiment of the present invention.

As shown in FIG. 5A, an active layer 502, a first current disconnection layer 503 and a second current disconnection layer 504 are sequentially formed on an upper surface of a n-InP semiconductor substrate 501 by a known MOCVD method.

Figure 5B:
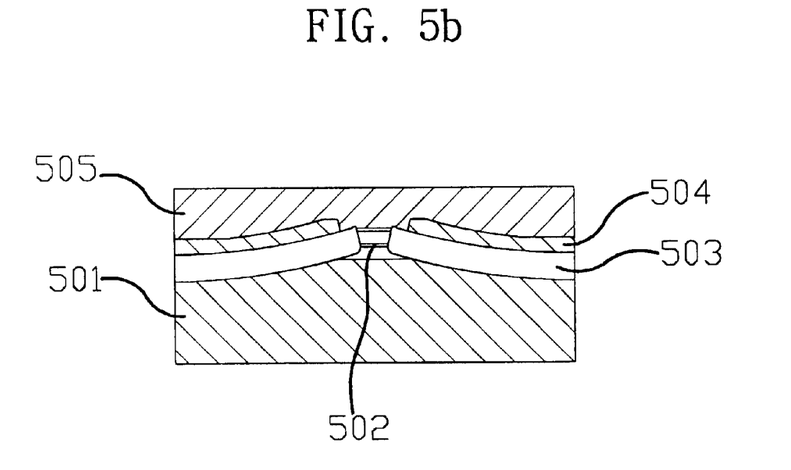

Next, as shown in FIG. 5B, a clad layer 505 is grown on the upper portions of the second current disconnection layer 504 and the active layer 506.

Figure 5C:
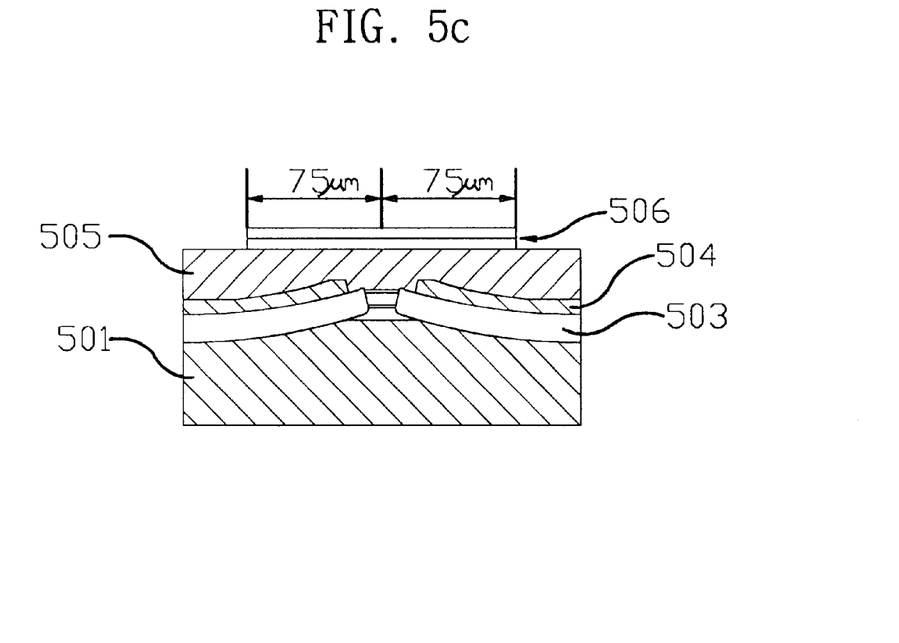

As shown in FIG. 5C, an etching mask layer 506 is formed on an upper surface of the clad layer 505. The etching mask layer 506 may be formed by patterning an oxide film or silicon nitride film using a photolithography process and etching process after the silicon oxide film or silicon nitride film is formed on an upper surface of the clad layer.

The etching mask layer 506 is positioned on an upper portion of the active layer. The size of the same is preferably 75 µm in both directions from the center portion of the active layer.

Figure 5D:
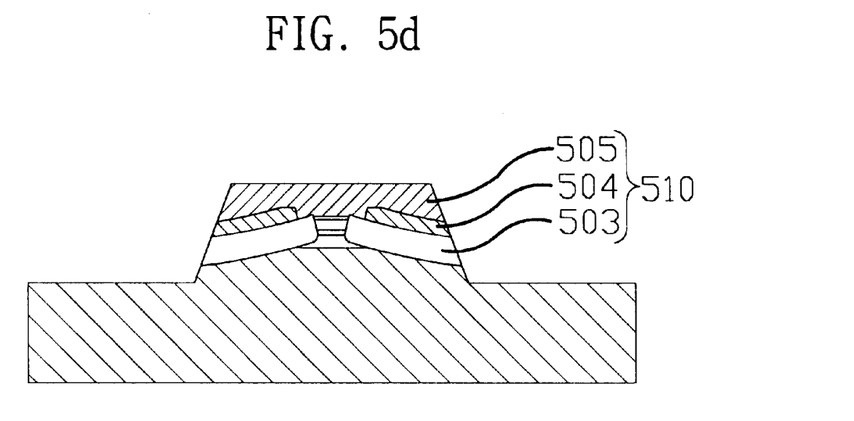
Figure 5E:
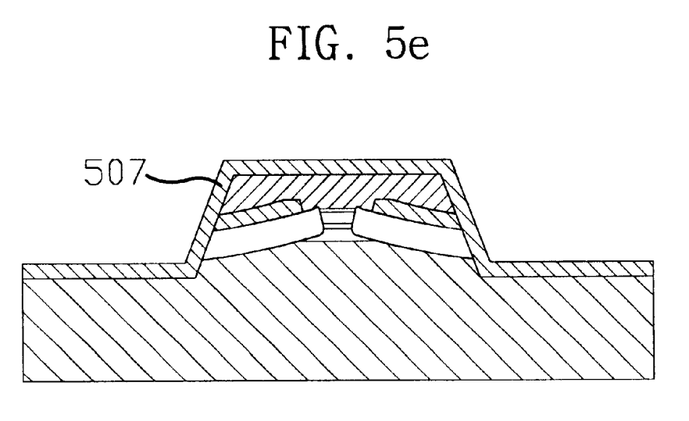

As shown in FIG. 5E, the clad layer 505, the second current disconnection layer 504, and the first current disconnection layer 503 are sequentially etched using a chemical etching method until the upper surface of the semiconductor substrate 501 is exposed. As a result, a trapezoid shape convex portion 510 formed of the clad layer 505, the second current disconnection layer 504 and the first current disconnection layer 503 is formed on the semiconductor substrate 501. At this time, the etching solution is $HCL:P_3OH$ or $HCL:CH_3COOH$.

Since the etching process is implemented by the chemical etching method, an under cut phenomenon occurs, so that the lateral surface of the convex portion 510 is slanted.

As shown in FIG. 5E, a silicon oxide film or a silicon nitride film 507 is deposited on a front surface of the structure of FIG. 5D.

Figure 5F:
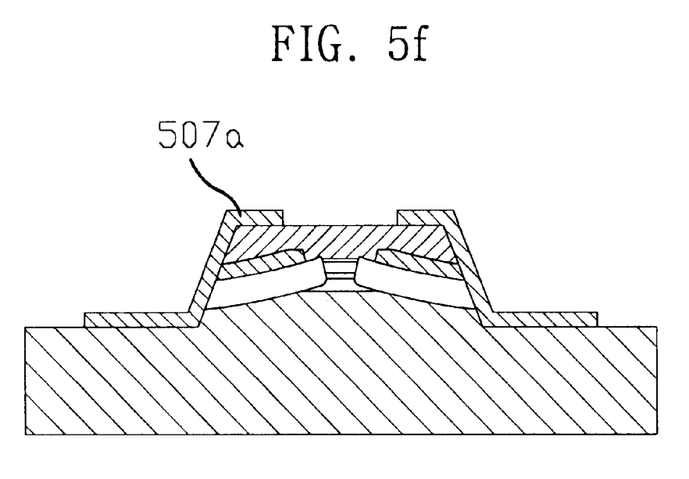

As shown in FIG. 5F, the silicon oxide film or silicon nitride film 507 are patterned, and the upper surfaces of the semiconductor substrate 501 and the clad layer 505 are exposed for thereby forming a protection film 507a.

Figure 5G:
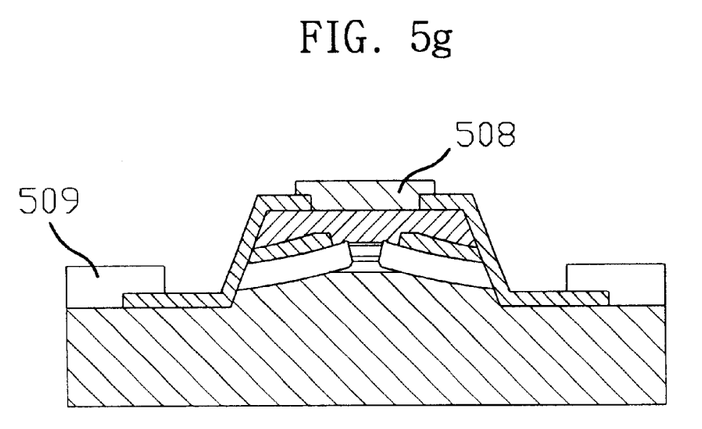

As shown in FIG. 5G, a first electrode 508 is formed on an upper surface of the clad layer 505, and a second electorde 509 is formed on an upper surface of the semiconductor substrate 501. The fabrication of the optical integrated circuit device according to the present invention is completed.

In the above description, the laser diode chip was explained as an example. The optical fiber may be easily aligned with the photo diode chip by the same fabrication process as the above-described fabrication method of the laser diode chip.

In the present invention, when aligning the optical integrated circuit device of the optical communication transmission and receiving apparatus module and the optical fiber, a protruded shape laser diode chip is used for easily adjusting the position during the alignment, so that it is possible to quickly and simply perform a manual alignment of the optical integrated circuit device and the optical fiber.

In addition, in the present invention, an expensive flip chip bonder which requires an accurate resolution is not needed. In the present invention, a few thousands optical integrated circuit devices are die-bonded at one time, so that it is possible to significantly decrease the time required for the alignment of the optical integrated circuit device and the optical fiber, and the price of the optical communication transmission and receiving apparatus module is largely decreased.

When mounting the integrated circuit device into the concave portion of the mounting apparatus, it is possible to prevent the convex portion of the optical integrated circuit device from being cracked by forming a protection film at a corner potion of the convex portion of the optical integrated circuit device, so that an error occurrence of the product is decreased.

The convex portion of the optical integrated circuit device is smoothly inserted into the concave portion of the mounting apparatus when assembling the optical integrated circuit device to the optical communication transmission and receiving module by forming the protection film for thereby implementing an easier assembling operation of the module.

In the present invention, a wire bonding process is not needed when mounting on the mounting apparatus of the optical communication apparatus module by forming all electrodes of the optical integrated circuit on the upper portion of the semiconductor substrate, so that the assembling cost of the optical communication apparatus module is decreased, and the assembling operation is easily obtained, and the assembling time is decreased.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. An optical integrated circuit device, comprising:

a semiconductor substrate;

a convex portion formed on an upper surface of the semiconductor substrate and having a taper shape lateral surface;

a protection film formed on a lateral wall surface of the convex portion;

a first electrode formed on an upper surface of the convex portion; and a second electrode formed on an upper surface of the semiconductor substrate, wherein said convex portion is formed of a first current disconnection layer, a second current disconnection layer and a clad layer.

2. The device of claim 1, wherein a gradient of the lateral wall surface of the convex portion is 10~70° in a direction perpendicular from the surface of the semiconductor substrate.

3. The device of claim 1, wherein said protection film is formed of a silicon film or a silicon nitride film.

4. An optical integrated circuit device fabrication method, comprising:

a step for selectively growing an active layer on an upper surface of a semiconductor substrate using a MOCVD method;

a step for selectively growing a first current disconnection layer on an upper surface of the semiconductor substrate at both sides of the active layer using the MOCVD method;

a step for selectively growing a second current disconnection layer on an upper surface of the first current disconnection layer;

a step for growing a clad layer on an upper surface of the second current disconnection layer and an upper portion of the active layer;

a step for forming an etching mask on an upper surface of the clad layer on the active layer;

a step for sequentially etching the clad layer, the second current disconnection layer and the first current disconnection layer which are not covered by the etching mask and exposing an upper surface of the semiconductor substrate;

a step for removing the etching mask;

a step for forming a protection film on the lateral walls of the clad layer, the second current disconnection layer and the first current disconnection layer; and a step for forming a first electrode on an upper surface of the protection film and a second electrode of an upper surface of the semiconductor substrate.

5. The method of 4, wherein said etching step is performed by a chemical etching method.

6. The method of claim 5, wherein said etching solution used for the chemical etching method is $HCL:P_3OH$ or $HCL:CH_3COOH$.

7. The method of claim 4, wherein said protection layer is formed of a silicon oxide film or a silicon nitride film.

8. An optical communication transmission and receiving apparatus module, comprising:

an optical integrated circuit device including a semiconductor substrate, a a convex portion formed on an upper surface of the semiconductor substrate and having a taper shaped lateral surface, a protection film formed on a lateral wall surface of the convex portion, a first electrode formed on an upper surface of the convex portion, and a second electrode formed on an upper surface of the semiconductor substrate, wherein said convex portion is formed of a first current disconnection layer, a second current disconnection layer and a clad layer;

a mounting apparatus having a concave portion having a reverse taper shaped lateral wall profile at an upper center portion of the same;

a third electrode having a part embedded in the mounting apparatus and another portion being extended to a lower surface of the concave portion; and a fourth electrode formed on an edge upper surface of the mounting apparatus, wherein the third electrode formed on a lower surface of the concave portion of the mounting apparatus and the first electrode of the optical integrated circuit device contact each other, and the second electrode of the optical integrated circuit device and the fourth electrode contact each other, and the protection film contacts with a lateral wall of the concave portion, so that the optical fiber and the optical integrated circuit device are manually aligned.

* * * * *